United States Patent
Wang et al.

(10) Patent No.: US 8,633,076 B2
(45) Date of Patent: Jan. 21, 2014

(54) METHOD FOR ADJUSTING FIN WIDTH IN INTEGRATED CIRCUITRY

(75) Inventors: Chien-Hsun Wang, Hsin Chu (TW); Chih-Sheng Chang, Hsinchu (TW); Yi-Tang Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 361 days.

(21) Appl. No.: 12/952,376

(22) Filed: Nov. 23, 2010

(65) Prior Publication Data

US 2012/0126325 A1     May 24, 2012

(51) Int. Cl.
*H01L 21/336*     (2006.01)

(52) U.S. Cl.
USPC ..... 438/279; 438/283; 438/284; 257/E21.421

(58) Field of Classification Search
USPC .......... 257/279, 283, 284, E21.421; 438/279, 438/283, 284, E21.421
See application file for complete search history.

(56) References Cited

U.S. PATENT DOCUMENTS

| | | | |
|---|---|---|---|
| 6,664,582 B2 | 12/2003 | Fried et al. | |
| 6,706,571 B1 | 3/2004 | Yu et al. | |
| 6,858,478 B2 | 2/2005 | Chau et al. | |
| 6,884,519 B2 | 4/2005 | Shimizu et al. | |
| 7,056,781 B2 | 6/2006 | Yoon et al. | |
| 7,173,305 B2 * | 2/2007 | Yang et al. | 257/326 |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 7,687,339 B1 * | 3/2010 | Schultz et al. | 438/197 |
| 7,763,531 B2 * | 7/2010 | Abadeer et al. | 438/532 |
| 7,807,523 B2 | 10/2010 | Liu et al. | |
| 7,829,951 B2 * | 11/2010 | Song et al. | 257/365 |
| 7,862,962 B2 | 1/2011 | Shieh et al. | |
| 7,898,037 B2 | 3/2011 | Chuang et al. | |
| 7,910,453 B2 | 3/2011 | Xu et al. | |
| 7,939,862 B2 | 5/2011 | Moroz et al. | |
| 7,943,986 B2 | 5/2011 | Yang et al. | |
| 7,960,232 B2 | 6/2011 | King et al. | |
| 7,989,355 B2 | 8/2011 | Shieh et al. | |

(Continued)

FOREIGN PATENT DOCUMENTS

JP     58178535     10/1983

OTHER PUBLICATIONS

Bartlomiej Jan Pawlak, et al., U.S. Appl. No. 12/569,689, "Method of Fabricating Finfet Device," filed Sep. 29, 2009, 21 pages.

(Continued)

*Primary Examiner* — Trung Q Dang
(74) *Attorney, Agent, or Firm* — Haynes and Boone, LLP

(57) ABSTRACT

A method includes growing a plurality of parallel mandrels on a surface of a semiconductor substrate, each mandrel having at least two laterally opposite sidewalls and a predetermined width. The method further includes forming a first type of spacers on the sidewalls of the mandrels, wherein the first type of spacers between two adjacent mandrels are separated by a gap. The predetermined mandrel width is adjusted to close the gap between the adjacent first type of spacers to form a second type of spacers. The mandrels are removed to form a first type of fins from the first type of spacers, and to form a second type of fins from spacers between two adjacent mandrels. The second type of fins are wider than the first type of fins.

20 Claims, 13 Drawing Sheets

(56) References Cited

U.S. PATENT DOCUMENTS

| | | |
|---|---|---|
| 8,053,299 B2 | 11/2011 | Xu |
| 8,062,963 B1 | 11/2011 | van Dal |
| 8,153,493 B2 | 4/2012 | Lee |
| 8,212,295 B2 | 7/2012 | Liaw |
| 8,278,173 B2 | 10/2012 | Lim et al. |
| 8,278,196 B2 | 10/2012 | Huang et al. |
| 8,283,231 B2 | 10/2012 | Merelle et al. |
| 8,286,114 B2 | 10/2012 | Chuang et al. |
| 8,310,013 B2 | 11/2012 | Lin et al. |
| 8,338,305 B2 | 12/2012 | Chen et al. |
| 8,357,569 B2 | 1/2013 | Pawlak et al. |
| 8,367,498 B2 | 2/2013 | Xu et al. |
| 8,373,229 B2 | 2/2013 | Chen et al. |
| 8,399,931 B2 | 3/2013 | Liaw et al. |
| 8,415,718 B2 | 4/2013 | Xu et al. |
| 2001/0003364 A1 | 6/2001 | Sugawara et al. |
| 2005/0153490 A1 | 7/2005 | Yoon et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0228372 A1 | 10/2007 | Yang et al. |
| 2008/0121948 A1 | 5/2008 | Kim et al. |
| 2008/0258228 A1 | 10/2008 | Chuang et al. |
| 2008/0263492 A1 | 10/2008 | Chuang et al. |
| 2008/0290470 A1 | 11/2008 | King et al. |
| 2008/0296632 A1 | 12/2008 | Moroz et al. |
| 2009/0035909 A1 | 2/2009 | Chang et al. |
| 2009/0065868 A1 | 3/2009 | Russ et al. |
| 2009/0181477 A1 | 7/2009 | King et al. |
| 2010/0006945 A1 | 1/2010 | Merelle et al. |
| 2010/0006974 A1 | 1/2010 | Xu et al. |
| 2010/0052059 A1 | 3/2010 | Lee |
| 2010/0183961 A1 | 7/2010 | Shieh et al. |
| 2010/0203734 A1* | 8/2010 | Shieh et al. ............. 438/706 |
| 2010/0237436 A1 | 9/2010 | Inaba |
| 2010/0264468 A1 | 10/2010 | Xu |
| 2011/0084336 A1 | 4/2011 | Luning et al. |
| 2011/0108961 A1* | 5/2011 | Cheng et al. ............. 257/623 |
| 2011/0117679 A1 | 5/2011 | Lee et al. |
| 2011/0147846 A1 | 6/2011 | Su et al. |
| 2011/0278676 A1 | 11/2011 | Cheng et al. |
| 2011/0282478 A1 | 11/2011 | Shen et al. |
| 2011/0283245 A1 | 11/2011 | Shen et al. |
| 2011/0317477 A1 | 12/2011 | Liaw |
| 2011/0317485 A1 | 12/2011 | Liaw |
| 2012/0009690 A1 | 1/2012 | Wann et al. |
| 2012/0012932 A1 | 1/2012 | Perng et al. |
| 2012/0068264 A1* | 3/2012 | Cheng et al. ............. 257/347 |
| 2012/0104472 A1 | 5/2012 | Xu et al. |
| 2012/0126326 A1 | 5/2012 | Wang et al. |
| 2012/0126375 A1 | 5/2012 | Wang et al. |

OTHER PUBLICATIONS

Hsien-Hsin Lin, et al., U.S. Appl. No. 12/703,918, "Method for Fabricating a Finfet Device," filed Feb. 11, 2010, 40 pages.

Chien-Chang Su, et al., U.S. Appl. No. 12/644,869, "Method for Incorporating Impurity Element in EPI Silicon Process," filed Dec. 22, 2009, 21 pages.

Tsung-Lin Lee, et al., U.S. Appl. No. 12/622,038, "Sacrificial Offset Protection Film for a Finfet Device," filed Nov. 19, 2009, 56 pages.

Jeff J. Xu, et al., U.S. Appl. No. 12/784,207, "Method of Forming EPI Film in Substrate Trench," filed May 20, 2010, 33 pages.

Tian-Choy, et al., U.S. Appl. No. 12/756,552, "Hybrid Gate Process for Fabricating Finfet Device," filed Apr. 8, 2010, 38 pages.

Ming-Lung Cheng, et al. U.S. Appl. No. 12/780,124, "Method and Apparatus for Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit for Finfet Devices," filed Jun. 30, 2010, 32 pages.

Jhon Jhy Liaw, U.S. Appl. No. 12/823,860, "Structure and Method for SRAM Cell Circuit," filed Jun. 25, 2010, 37 pages.

Jhon Jhy Liaw, et al., U.S. Appl. No. 12/827,690, "Layout for Multiple-Fin SRAM Cell," filed Jun. 30, 2010, 35 pages.

Jeng-Jung Shen, et al., U.S. Appl. No. 12/780,060, "Automatic Layout Conversion for Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12/840,830, "High Surface Dopant Concentration Semiconductor Device and Method of Fabricating," filed Jul. 21, 2010, 21 pages.

Peng-Soon Lim, et al., U.S. Appl. No. 12/827,512, "Gate Structures and Method of Fabricating Same," filed Jun. 30, 2010, 41 pages.

Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device and Method of Manufacturing Same," filed Oct. 18, 2010, 55 pages.

Jeff J. Csu, et al, U.S. Appl. No. 12/917,902, "Fin-Like Field Effect Transistor (FINFET) Device and Method of Manufacturing Same," filed Nov. 2, 2010, 61 pages.

Mark van Dal, U.S. Appl. No. 12/900,895, "Method of Fabricating a Semiconductor Device Having an Epitaxly Region," filed Oct. 8, 2010, 21 pages.

Hsin-Chih Chen, et al, U.S. Appl. No. 12/907,272, "Multi-Fin Device by Self-Aligned Castle Fin Formation," filed Oct. 19, 2010, 34 pages.

Chien-Shun Wang, et al, U.S. Appl. No. 12/949,881, "Method for Forming Metrology Structures From Fins in Integrated Circuitry," filed Nov. 19, 2010, 16 pages.

Chien-Hsun Wang, et al, U.S. Appl. No. 12/953,148, "Device and Method for Forming Fins in Integrated Circuitry," filed Nov. 23, 2010, 39 pages.

* cited by examiner

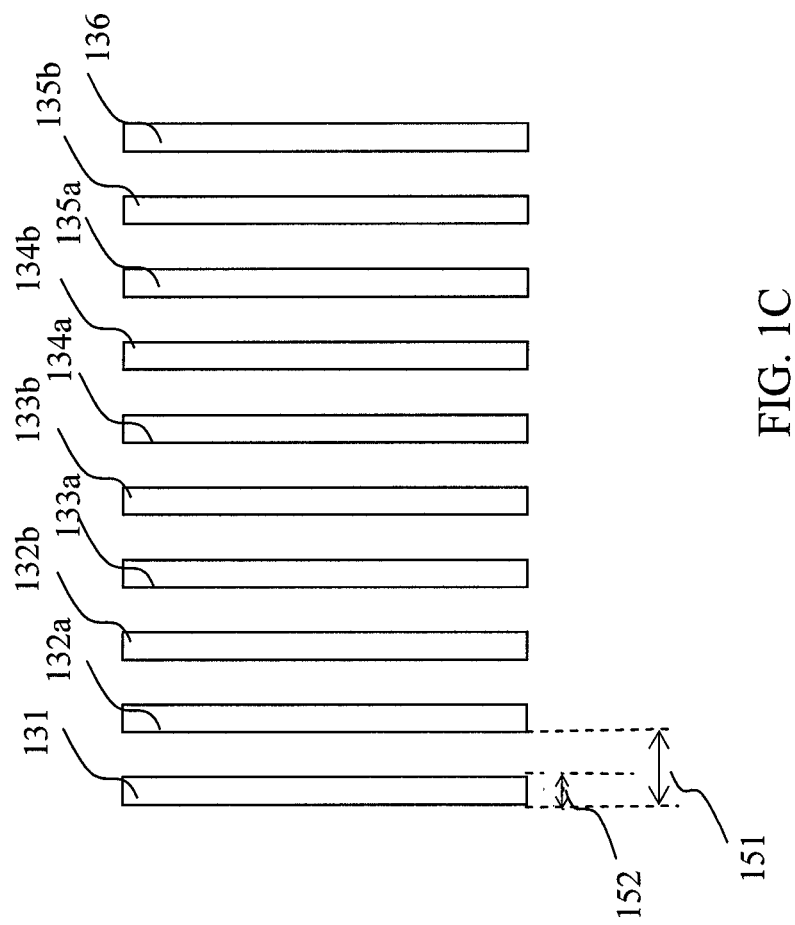

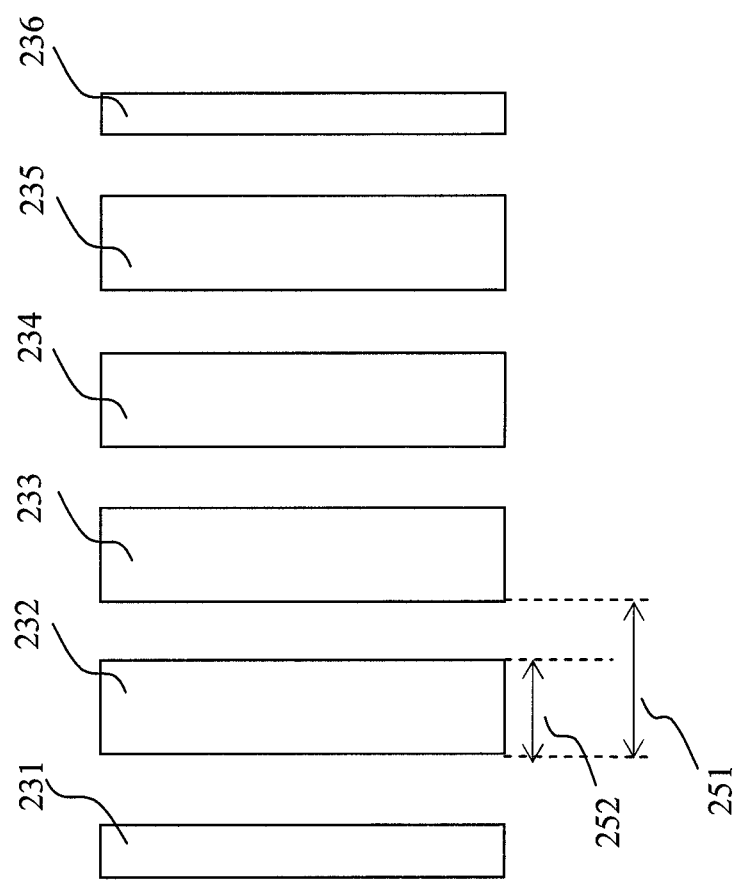

METHOD FOR ADJUSTING FIN WIDTH IN INTEGRATED CIRCUITRY

The present disclosure is related to the following commonly-assigned U.S. patent applications the entire disclosures of which are incorporated herein by reference: U.S. patent application Ser. No. 12/949,881 filed on Nov. 19, 2010, entitled "Method for Forming Metrology Structures from Fins in Integrated Circuitry"; and U.S. patent application Ser. No. 12/953,148 filed on Nov. 23, 2010, entitled "Devices and Method for Forming Fins in Integrated Circuitry."

BACKGROUND

The present disclosure relates generally to semiconductor manufacturing, and more particularly, to integrated circuit devices and methods for forming such devices.

The semiconductor industry continues to have goals of higher density, higher performance, and lower cost. Scaling of device size has been a major tool user to reach these goals. However, scaling beyond the 100 nm process technology node has several difficulties associated with it, such as gate-oxide thickness, source and drain doping depths, and current density. These difficulties have resulted in new device structures to improve the existing metal oxide semiconductor field effect transistor (MOSFET) devices. Some of these new device structures include multi-gate MOSFET devices. A fin field effect transistor (FinFET) is a kind of multi-gate device which has a channel formed as a vertical fin. Multiple gates are formed over and along the sides of the vertical fin. A FinFET allows for a range of channel lengths and provides a broader process window for gate structures. FinFET devices typically include high aspect-ratio semiconductor fins in which the channel and source/drain regions for the transistor are formed. The increased surface area of the channel and source/drain regions in a FinFET results in faster, more reliable and better-controlled semiconductor transistor devices. These advantages have found many new applications in various types of semiconductor devices.

A process for making a FinFET device uses stringent process control, including in the area of contact landing. For example, contact holes need to overlay with thin vertical fin channels or raised source/drain well-pick-up lines. Process control for contact landing gets even more difficult when horizontal and vertical gate lines co-exist in multi-gate FinFET structures.

As such, there is need for improving fin structures and other aspects of FinFET integrated circuitry.

SUMMARY

The present disclosure provides a method for forming fins in a semiconductor FinFET device. In one embodiment, the method includes growing a plurality of parallel mandrels on a surface of a semiconductor substrate, each mandrel having at least two laterally opposite sidewalls and a predetermined width. The method further includes forming a first type of spacers on the sidewalls of the mandrels, wherein the first type of spacers between two adjacent mandrels are separated by a gap. The predetermined mandrel width is adjusted to close the gap between the adjacent first type of spacers to form a second type of spacers. The mandrels are removed to form a first type of fins from the first type of spacers, and to form a second type of fins from spacers between two adjacent mandrels. The second type of fins are wider than the first type of fins.

In another embodiment, the method includes forming a first, second, and third mandrel on a surface of a semiconductor substrate, each mandrel having at least two laterally opposite sidewalls and a first width. The first and second mandrels are adjacent to each other, the third mandrel is a distance away from either the first or second mandrel. The method further includes forming spacers on the sidewalls of all three mandrels, wherein the spacers between the first and second adjacent mandrels are separated by a gap. The first width is adjusted to close the gap between the spacers between the first and second adjacent mandrels. The mandrels are removed to form a first fin from the spacers between the first and second mandrels, and a second fin from a spacer of the third mandrel.

The present disclosure also describes an integrated circuit device. In one embodiment, the device includes a substrate and first and second fins on the substrate. The first fin is about twice as wide as the second fin. The device also includes a gate dielectric layer on the first fin and a gate electrode on the gate dielectric layer. The gate electrode is in a direction perpendicular to a direction of the first fin.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1C is the top view of the array of fin structures resulted from the array of mandrels and spacers shown in FIG. 1A and FIG. 1B.

FIG. 3A and FIG. 3B are cross section and top views of an array of wider fin structures resulted from the array of mandrels and merged spacers shown in FIG. 2A and FIG. 2B.

DETAILED DESCRIPTION

Figure 1A:
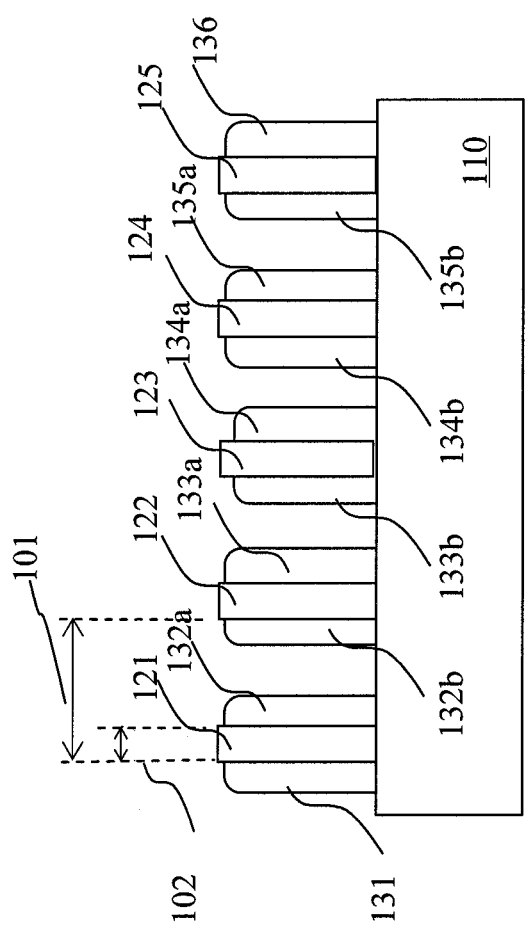
FIG. 1A is a cross section of an array of mandrels and spacers used in FinFET devices.

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, the present disclosure may repeat reference numerals and/or letters in the various examples. This repetition is for the purpose of simplicity and clarity and does not in itself dictate a relationship between the various embodiments and/or configurations discussed. The specific embodiments discussed are merely illustrative and do not limit the scope of the invention.

Fin field effect transistors (FinFETs) use a substantially rectangular fin structure which can be formed in several ways. In a first method, bulk silicon on a substrate is etched into rectangular fin shape by first depositing a hardmask layer on the bulk silicon. The hardmask forms a pattern covering the top of the fins. The bulk silicon is then etched to form trenches between the regions covered by the hardmask layer. The trenches are formed into shallow trench isolation (STI) features by depositing a dielectric material, usually silicon oxide, into the trench. The dielectric material is usually deposited in excess to completely cover the fins and optionally the hardmask layer if not already removed. The dielectric material is planarized down to the top surface of the fin/hardmask, and then etched to a level below the top of the fin so that a portion of the fin protrudes above the STI.

In a second method, the STI features are formed first on bulk silicon material by depositing an STI layer and etching trenches into it. The bottoms of the trenches between the STI features are exposed bulk silicon. Silicon is then grown in the trenches to form the fins by using, for example, an epitaxial process. Once a desired fin height is reached, then the STI is etched to a level below the top of the fin to expose a portion of the fin. The bulk silicon material may be a silicon substrate or deposited silicon such as silicon-on-insulator (SOI) with a barrier oxide (BOX) layer between the SOI and the underlying silicon substrate.

Both methods above use a photomask process at the desired fin dimension, often at or beyond the limit of the current photolithography technology. With the increasing demand to reduce device size, a variation of the first method was developed, in which elongated mandrels are used as a hardmask for etching into the bulk silicon, leaving thin spacers at both lateral sides of mandrel as fins after the mandrels are removed. The mandrel/spacer process is described in FIG. 1A and FIG. 1B.

Figure 1B:
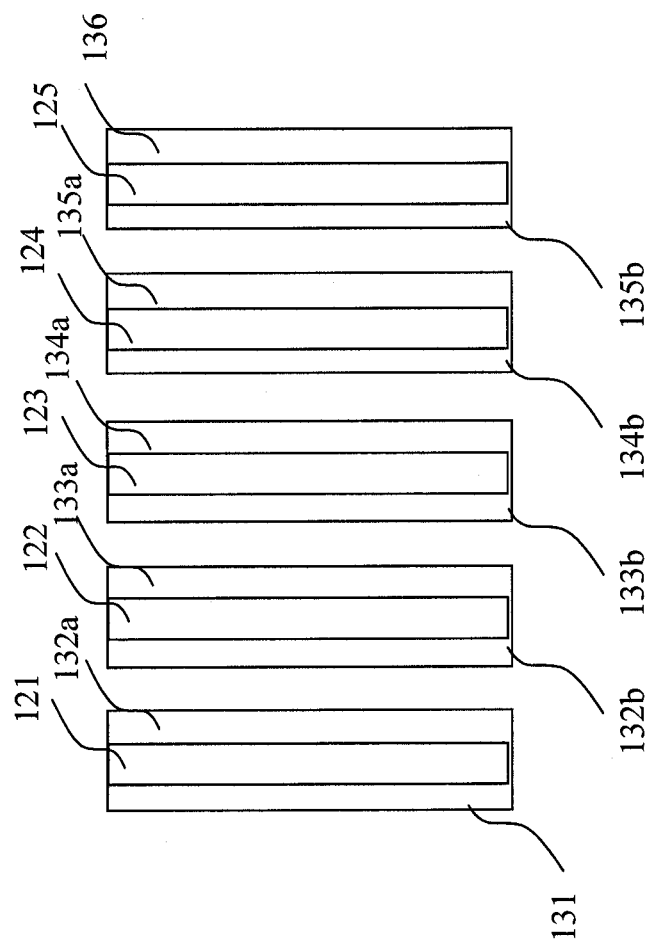
FIG. 1B illustrates the top view of the array of mandrels and spacers corresponding to FIG. 1A.

Referring to FIGS. 1A-1C, a semiconductor substrate 110, such as a silicon substrate, or a silicon on oxide substrate. The substrate includes an array of mandrels. Mandrels 121, 122, 123, 124, and 125 is formed by a photolithography and etch process. The mandrels are spaced at a pitch 101 and have a width 102. A conformal spacer material is then deposited around each of the mandrels 121, 122, 123, 124, and 125, forming a spacer array. In the present embodiment, the spacer array is made of a hardmask material, and spacer sidewalls 131, 132a, 132b, 133a, 133b, 134a, 134b, 135a, 135b, and 136 are thinner than the width of the mandrels 121, 122, 123, 124, and 125. In the present embodiment, the pitch and width of the mandrel array are selected such that facing sidewalls of a pair of adjacent mandrel structures are separated from each other at a distance on the order of the width 102 of a mandrel. As can be seen, mandrels 121, 122, 123, 124, and 125 are sandwiched between spacer sidewalls 131 and 132a, 132b and 133a, 133b and 134a, 134b and 135a, 135b and 136 respectively.

The mandrels 121, 122, 123, 124, and 125 between the spacers are then removed in a subsequent etching operation to leave just the spacers behind, now referred to as fin structures. It is understood that the fin structures can be used as a hardmask for etching the silicon layers below, forming additional fin structures. Using the mandrel/spacer method, the fin structures 131, 132a, 132b, 133a, 133b, 134a, 134b, 135a, 135b, and 136 are very thin and close together, and can be formed without a difficult lithography process. Thus formed fin structures have a width 152 at a pitch 151 (FIG. 1C), which can be half the mandrel pitch 101. For example, the mandrel pitch varies from 20 nm to 200 nm, the mandrel width varies from 10 nm to 100 nm, and the fin width varies from 5 nm to 80 nm. The vertical fin structures are the building blocks for forming gate channels for double, triple, and multiple gate transistors in a FinFET process.

It may further be a desire to form fin structures of different widths. For example, a number of circuit components may use various lateral dimensions for various vertical structures, which may benefit from multi-sized fin structures. Furthermore, it may be desired for the fin structures formed in the above mandrel and spacer process to provide relatively large contact landing areas on the top surface of a connection line. In addition, it may be desired to improve well-pick-up in source and drain structures, as well as improved emitter efficiency in bipolar junction transistor (BJT) integrated circuits.

A modification of the above-described method is discussed below to achieve one or more of the above-listed desires. It is further desired for the modification to maintain the fin density within the confines of existing transistor structures. Furthermore, it may be undesirable to require new photomasks to be made, especially for an existing product. Hence, it is desired to avoid creating new photomasks, and form FinFETs within the confines of the existing transistor structures so that layouts of other layers are not affected.

Figure 2A:
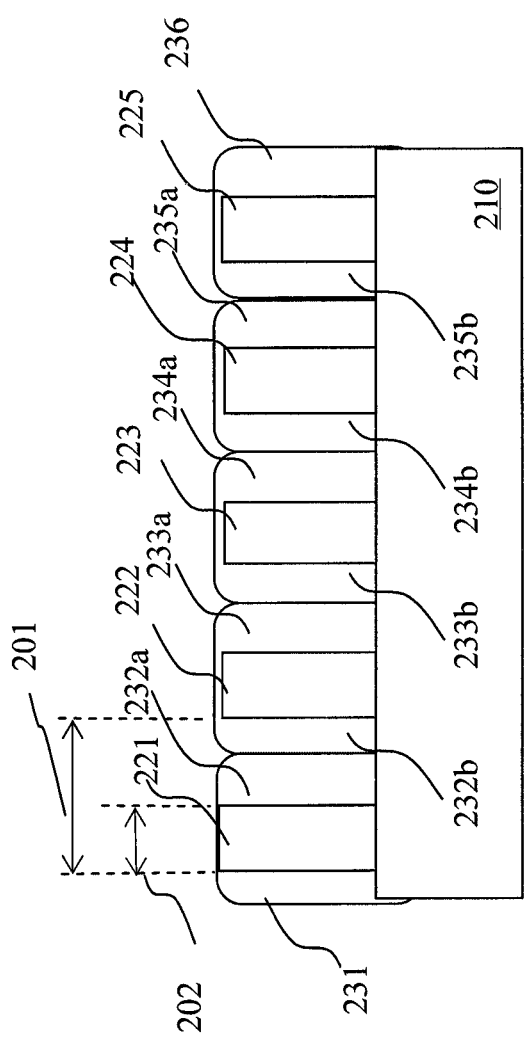
FIG. 2A and FIG. 2B are cross section and top views of an array of parallel mandrels and spacers when merged spacer technique is applied, in accordance with certain embodiments of the present disclosure.
Figure 2B:
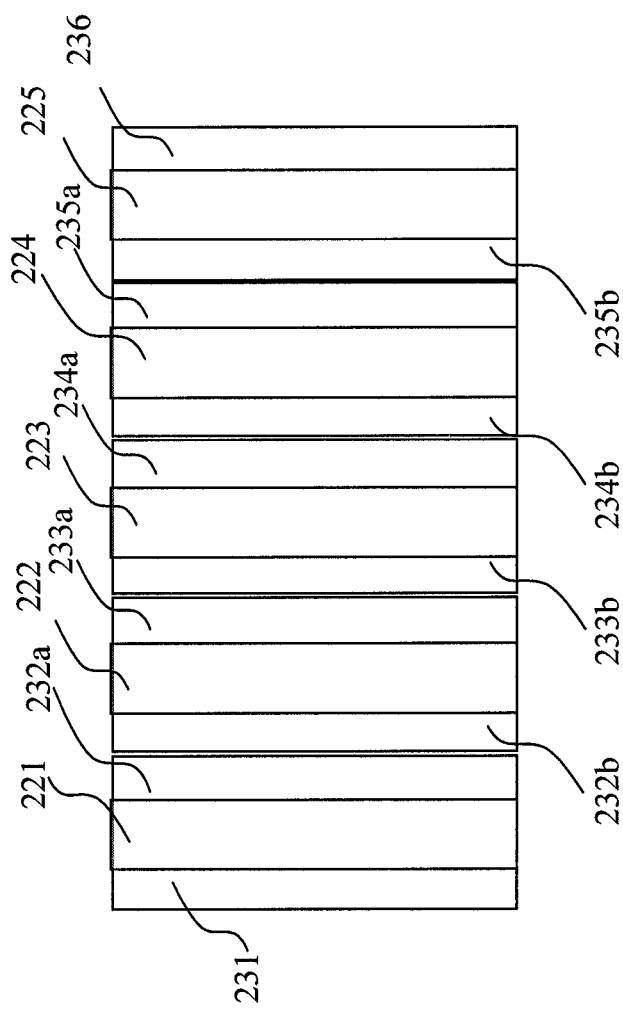

Referring now to FIGS. 2A-2B, a method of making fin structures in a semiconductor substrate 210, such as a silicon substrate or silicon on oxide substrate is provided. For the sake of reference, this method will be referred to as the spacer-merging process. An array of mandrels 221, 222, 223, 224, and 225 is formed by a photolithography and etch process. Based on device requirement for a specific fin dimension, the mandrel array is designed to have a pitch 201 and a width 202 that are appropriate to form the desired fins. A conformal spacer material is then deposited around the mandrels 221, 222, 223, 224, and 225. The conformal spacer array is usually made of a hardmask material. In addition, spacer sidewalls 231, 232a, 232b, 233a, 233b, 234a, 234b, 235a, 235b, and 236 are thinner than the width of the mandrels 221, 222, 223, 224, and 225. The pitch and width of the mandrel array can be designed such that nearby facing sidewalls of a pair of adjacent mandrel structures actually touch and merge into one structure. As shown in FIG. 2B, mandrels 221, 222, 223, 224, and 225 are sandwiched between spacer sidewalls 231 and 232a, 232b and 233a, 233b and 234a, 234b and 235a, 235b and 236, respectively. Facing sidewalls 232a and 232b, 233a and 233b, 234a and 234b, and 235a and 235b are located very closely to each other, or are touching each other respectively.

Figure 3A:
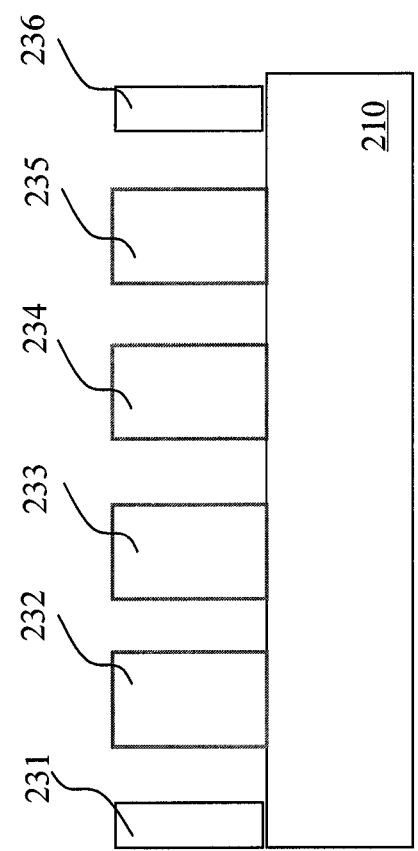

Now referring to FIGS. 3A-3B, the mandrel material between the spacers is then removed in a subsequent etching operation to leave just the spacers behind, which are now referred to as the desired fin structures. The fin structures 232, 233, 234, and 235 are formed from joining the nearby spacers 232a and 232b, 233a and 233b, 234a, and 234b respectively. As shown in FIG. 3B the thus formed fins 232, 233, 234, and 235 have a wider width 252 at a pitch 251, which is the same as the mandrel pitch 201. At the same time, fin structures 231 and 236 are not merged with other spacers; therefore fin structures 231 and 236 have their fin width unchanged. The pitch 251 is changed within the allowed range by the device layouts in the full process. For example, the mandrel pitch may vary from 20 nm to 200 nm, its width may vary from 10 nm to 100 nm, and the fin width varies from 5 nm to 180 nm. The wider vertical fin structures can be used for forming connector lines for well-pick-ups, for contact landing pads in Fin IC circuits, for BJT emitter channels, and other applications that desire wider fins.

Figure 4A:
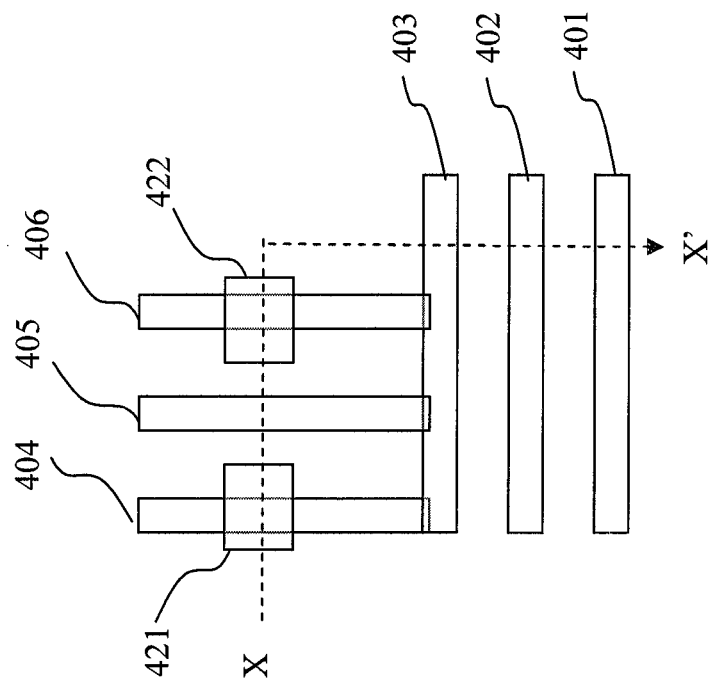
FIG. 4A is a top view of contact connections with an array of L-shaped and T-shaped spacers used in FinFET devices.
Figure 4B:
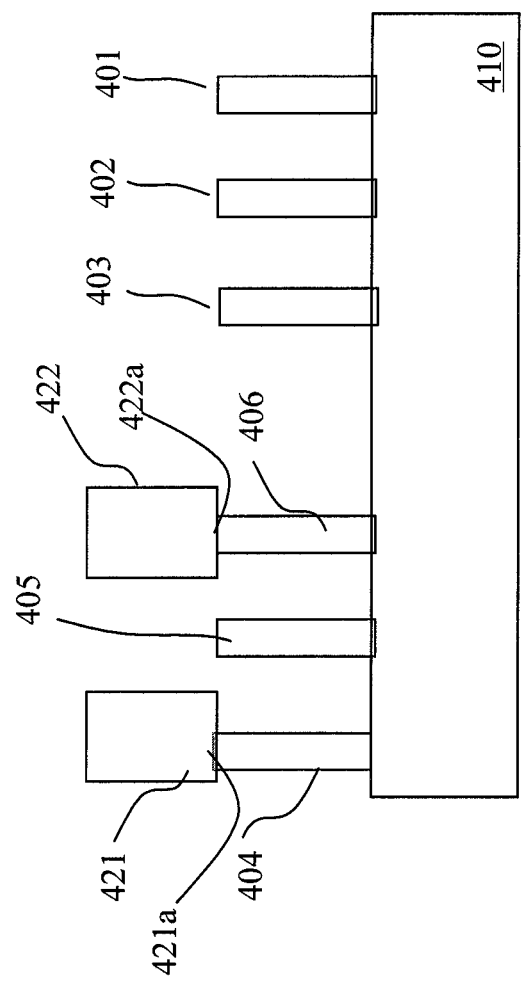
FIG. 4B illustrates a cross sectional view of the contact connections with the L-shaped and T-shaped fin array, along the X-X' cut line shown in FIG. 4A.

Referring to FIGS. 4A-4B, an array of L-shaped and T-shaped spacers is provided. Horizontal fins 401, 402, 403 and vertical fins 404, 405, and 406 are fabricated using a mandrel and spacer process similar to that in FIG. 1A, FIG. 1B, and FIG. 1C. Fin 404 is an L-shaped fin, and 405 and 406 are T-shaped fins according to their shapes in the layout. Contacts 421 and 422 are overlaid on fins 404 and 406 respectively. Fins 404 and 406 each form a contact landing surface 421a and 422a as shown in FIG. 4B. The lateral dimension of fins 401, 402, and 403 form gate channels for FinFETs, therefore they may be appropriate and do not need any changes. However, lateral dimension of connection line fins 404 and 406 are too thin for forming good contact landing.

Figure 5A:
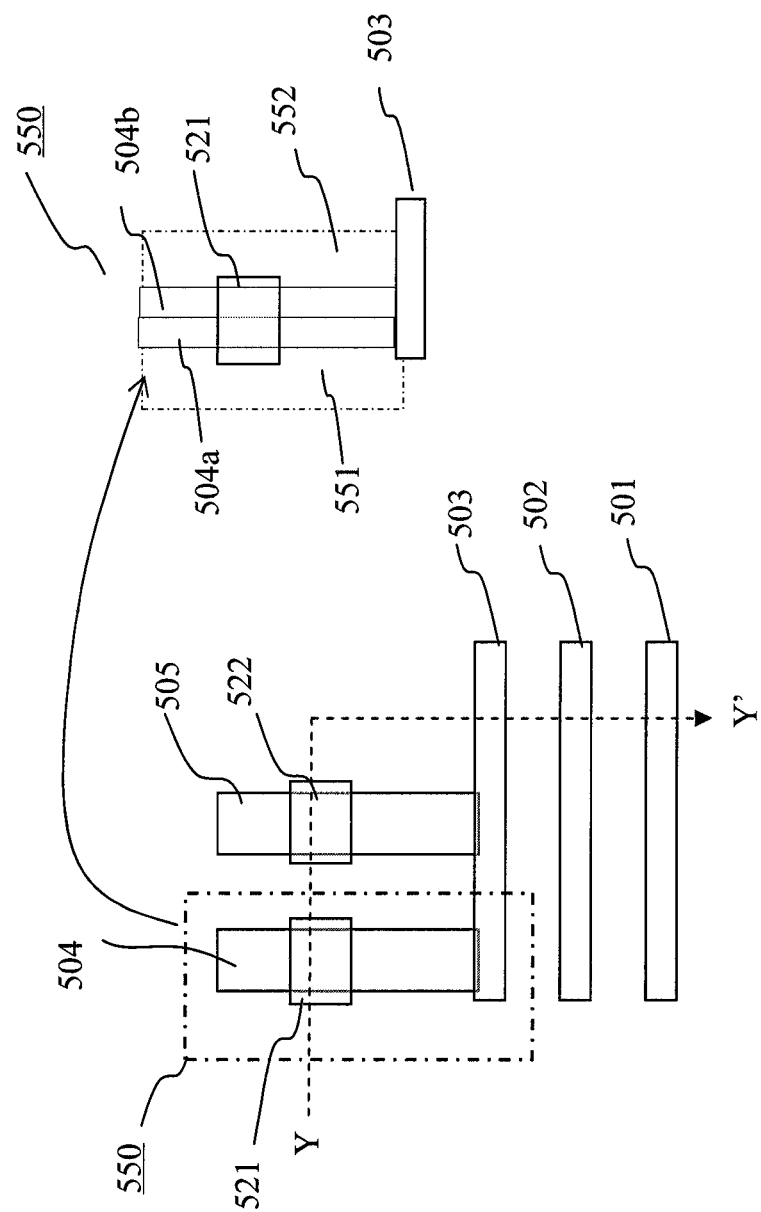
FIG. 5A is a top view of contact connections with an array of L-shaped and T-shaped spacers used in FinFET devices when merged spacer technique is applied.
Figure 5B:
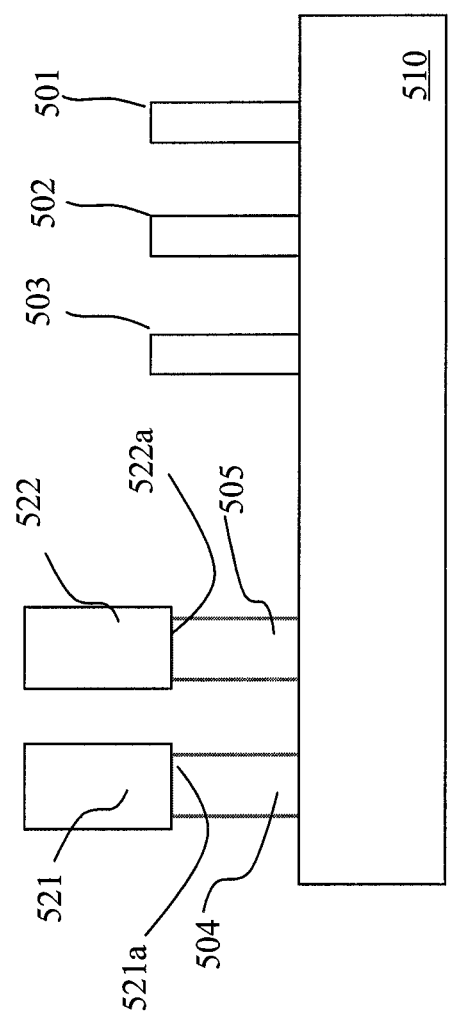
FIG. 5B is a cross sectional view of the contact connections with the L-shaped and T-shaped fin array, along the Y-Y' line shown in FIG. 5A, in accordance with some embodiments of the present disclosure.

Referring to FIGS. 5A-5B, another array of L-shaped and T-shaped spacers is provided. Horizontal fins 501, 502, 503 and vertical fins 504 and 505 are fabricated using the spacer-merging process. Fin 504 is an L-shaped fin and 505 is a T-shaped fin according to their shapes in the layout. Contacts 521 and 522 are overlaid on fins 504 and 505 respectively. Fins 504 and 505 are lines each forming a contact landing surface 521a and 522a as shown in FIG. 5B. Block 550 in FIG. 5A is enlarged to illustrate an intermediate layout with a pair of adjacent mandrels 551 and 552 and their merged sidewall spacers 504a and 504b before contact 521 is overlaid on top. And FIG. 5B illustrates a cross sectional view of a contact connection with the array of L-shaped and T-shaped spacers, along the dashed Y-Y' cut line in FIG. 5A. Lateral dimension of fins 501, 502, and 503 remain narrow to form gate channels for FinFETs. The lateral dimension of connection line fins 504 and 505 are doubled from single fins 504a and 504b, resulting in improved contact landing areas to 521a and 522a.

Figure 6:
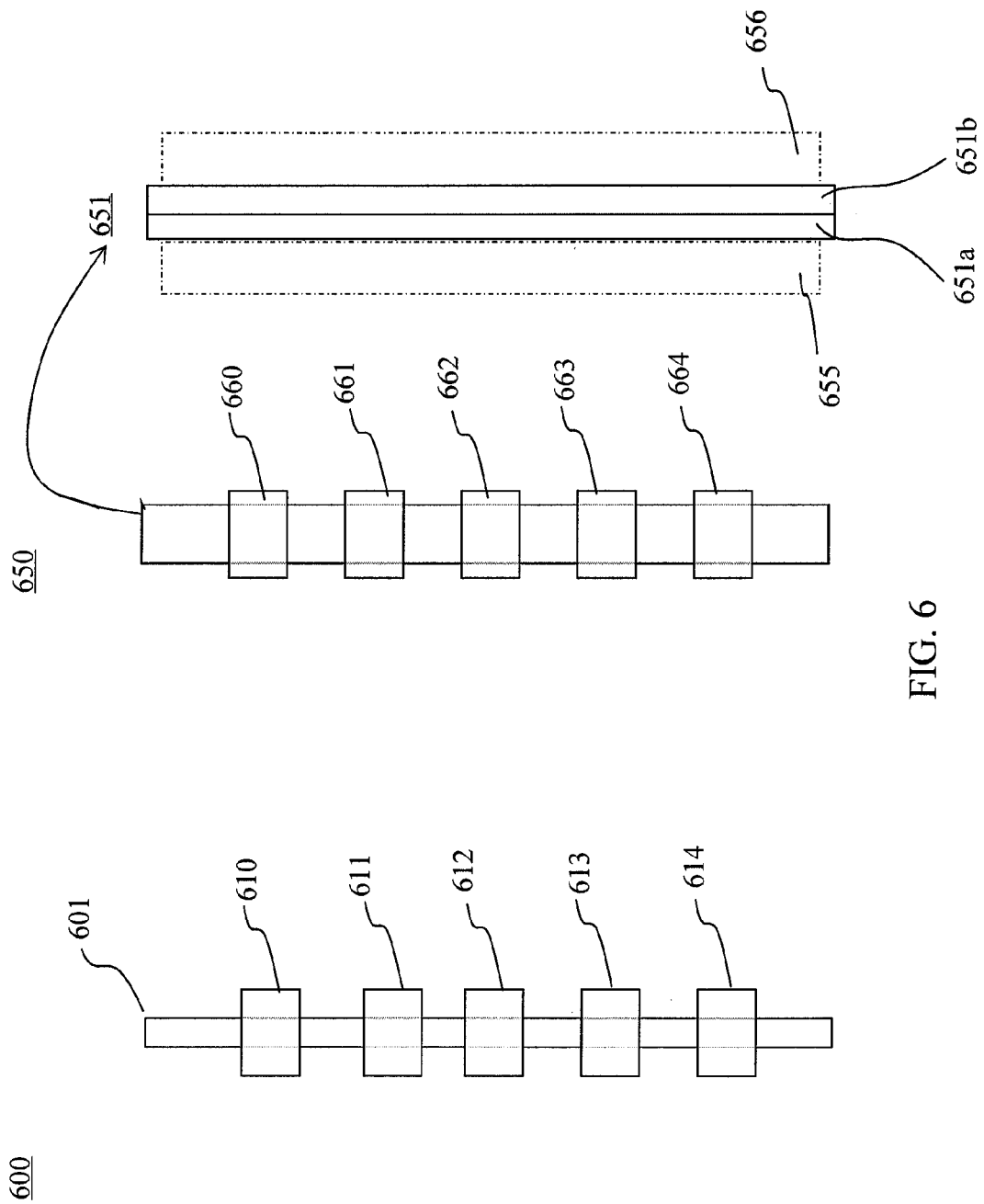
FIG. 6 compares a contact connection structure having a thin fin structure and another contact connection structure having a wider fin structure when merged spacer technique is applied, in accordance with some embodiments of the present disclosure.

Referring to FIG. 6, a contact connection structure 600 having a thin fin structure and a contact connection structure 650 having a wider fin structure are shown. The fin structures can be created using the merged spacer technique as discussed above. A narrower fin structure 601 forms connections with contacts 610, 611, 612, 613, and 614, where contact landings are limited by the lateral width of fin line 601. However, contact connection structure 650 has a wider fin structure 651 to provide contact landing areas for contacts 660, 661, 662, 663, and 664. Block 651 in FIG. 6 illustrates an intermediate layout with a pair of adjacent mandrels 655 and 656 and their merged spacers 651a and 651b before contacts 660, 661, 662, 663, and 664 are overlaid on the top surface of line 651. As a result, the lateral dimension of connection line fin 651 is doubled from the single fins 651a and 651b to form improved contact landing.

Figure 7:
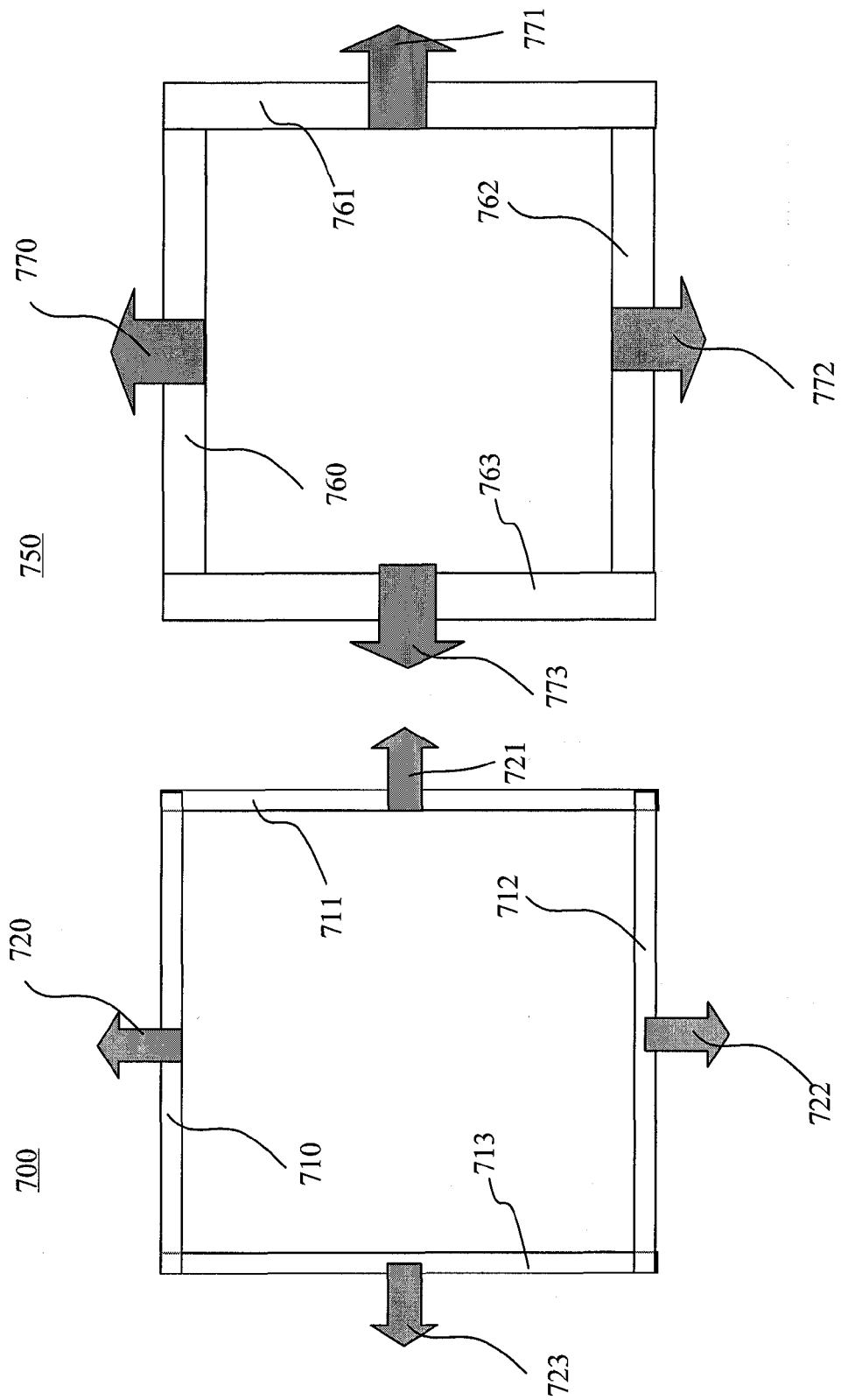
FIG. 7 compares an emitter ring of bipolar junction transistors (BJT) built on a thin fin structure and another emitter ring of BJT built on a broadened fin structure when merged spacer technique is applied, in accordance with various embodiments of the present disclosure.

FIG. 7 compares different emitter ring layouts of bipolar junction transistors (BJT) built according to the two methods discussed above. A bipolar junction transistor is a collector-base-emitter three-terminal transistor having a charge flow due to bidirectional diffusion of charge carriers across junctions from two regions of different charge concentrations.

Layout 700, formed by the method of FIG. 1, illustrates an emitter ring formed of four thin fin structure sides 710, 711, 712, and 713. Other transistor components built on the emitter ring are not shown. A BJT emitter is heavily doped to increase the emitter injection efficiency. For high current gain, most of the carriers injected into the emitter-base junction come from the emitter. Therefore, emitter injection currents 720, 721, 722, and 723 in the integrated BJT circuits can be limited from the narrow emitter fins 710, 711, 712, and 713 as fin dimension keeps on shrinking.

In layout 750, formed by the spacer-merging process, emitter injection currents 770, 771, 772, and 773 in the integrated BJT circuits are largely increased from the broadened emitter fins 760, 761, 762, and 763. The wider fins 760, 761, 762, and 763 are formed with the merged spacer technique described above. As a result of the wider emitter fins, BJT emitter efficiency is improved in 750.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a FinFET device comprising:
    forming a first mandrel having a first sidewall and an opposing second sidewall,
    forming a second mandrel having a third sidewall and an opposing fourth sidewall;
    wherein a space interposes the first and second mandrels, and wherein the space has a first width and is defined by the second sidewall and the third sidewall;
    forming a first spacer element abutting the first sidewall, a second spacer element abutting the second sidewall, a third spacer element abutting the third sidewall, and a fourth spacer element abutting the fourth sidewall; wherein the second spacer element contacts the third spacer element to form a contiguous enlarged spacer element having the first width;
    using the contiguous enlarged spacer element to form a first fin structure having the first width; and
    forming a second fin structure using at least one of the first spacer element and the fourth spacer element.

2. The method of claim 1, further comprising:
    forming a contact structure on the first fin.

3. The method of claim 1, further comprising:
    forming a contact dielectric layer over the first fin; and
    forming a contact hole in the contact dielectric layer, wherein the contact hole is coupled the first fin.

4. The method of claim 1, wherein the second fin structure has a width approximately half of the first width.

5. The method of claim 1, further comprising:
removing the first and second mandrels after forming the spacer elements and prior to using the contiguous enlarged spacer element to form the first fin structure.

6. The method of claim 1, wherein the removing includes an etching process.

7. The method of claim 1, further comprising:
forming a connector line for a well-pick up using the first fin structure.

8. The method of claim 1, further comprising:
forming a gate channel for the FinFET device in the second fin structure.

9. A method of fabricating a FinFET device comprising:
forming a first plurality of fin structures in a first direction on a semiconductor substrate, wherein each of the first plurality of fin structures, and wherein the forming the first plurality of fin structures includes:
forming a first mandrel and a second mandrel on the semiconductor substrate, wherein a space interposes the first and second mandrels, and wherein the space is substantially equal to a first width;
forming a layer of material in the space;
after forming the layer of material, removing the first and second mandrels to provide a feature of the layer of material having the first width;
using the feature to form a first fin of the first plurality of fin structures;
forming a second plurality of fin structures in a second direction, wherein the first and second directions are perpendicular to each other, and wherein a first fin structure of the first plurality of fin structures contacts a first fin of the second plurality of fin structures; and
forming a contact on the first fin of the first plurality of fin structures.

10. The method of claim 9, wherein the first width is greater than approximately twice a width of each fin of the second plurality of fin structures.

11. The method of claim 9, further comprising:
forming a gate channel for the FinFET device in a fin of the second plurality of fin structures.

12. The method of claim 9, wherein forming the first mandrel and the second mandrel includes providing the first mandrel and the second mandrel each having a width of between approximately 20 nanometers (nm) to approximately 200 nm.

13. The method of claim 9, wherein forming the first mandrel and the second mandrel includes providing the first mandrel and the second mandrel having a pitch of between approximately 20 nanometers (nm) and approximately 200 nm.

14. The method of claim 9, wherein the forming the second plurality of fin structures in the second direction includes:
forming a third mandrel and a fourth mandrel;
forming spacer elements on sidewalls of each of the third mandrel and the fourth mandrel; and
using the spacer elements to form the second plurality of fin structures.

15. The method of claim 14, further comprising:
providing a gap between the spacer elements on the sidewalls of the third mandrel and the fourth mandrel.

16. A method comprising:
forming a first mandrel with a first and an opposing second sidewall on a semiconductor substrate;
forming a second mandrel adjacent the first mandrel, the second mandrel having a third and an opposing fourth sidewall, wherein the first and second mandrels are separated by a first space having a first width defined by the second sidewall and the third sidewall;
forming a third mandrel on the semiconductor substrate, the third mandrel having a fifth and an opposing sixth sidewall;
forming a plurality of spacer elements including a spacer element abutting each of the first, second, third, fourth, fifth and sixth sidewalls, wherein the plurality of spacer elements includes a first spacer element abutting the second sidewall and a second spacer element abutting the third sidewall, wherein the first spacer element physically contacts the second spacer element, thereby providing a contiguous element;
removing the first, second, and third mandrels after forming the plurality of spacer elements; and
thereafter, using the plurality of spacer elements including the spacer elements abutting the first, fourth, fifth and sixth sidewalls and the contiguous element to form a plurality of fins of a fin-type field effect transistor (FinFET) on the semiconductor substrate, wherein the plurality of fins include fins of at least two different widths.

17. The method of claim 16, wherein a width of the contiguous element is greater than approximately twice a width the spacer element abutting the first sidewall.

18. the method of claim 16, wherein the contiguous element completely fills a space between the second sidewall and the third sidewall.

19. The method of claim 16, further comprising:
forming a contact element on a fin of the FinFET transistor defined by the contiguous element.

20. The method of claim 16, further comprising:
providing the semiconductor substrate, wherein the semiconductor substrate is a silicon-on-insulator substrate.

* * * * *